(12) United States Patent
Kim et al.

(10) Patent No.: US 9,691,844 B2
(45) Date of Patent: Jun. 27, 2017

(54) POWER SEMICONDUCTOR DEVICE

(71) Applicant: Magnachip Semiconductor, Ltd., Cheongju-si (KR)

(72) Inventors: In Su Kim, Cheongju-si (KR); Jeong Hwan Park, Gumi-si (KR); Seung Sik Park, Gumi-si (KR); Ha Yong Yang, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 14/939,119

(22) Filed: Nov. 12, 2015

(65) Prior Publication Data

US 2016/0336393 A1 Nov. 17, 2016

(30) Foreign Application Priority Data

May 12, 2015 (KR) ........................ 10-2015-0066304

(51) Int. Cl.
| | |
|---|---|
| *H01L 29/06* | (2006.01) |
| *H01L 29/739* | (2006.01) |
| *H01L 29/423* | (2006.01) |
| *H01L 23/528* | (2006.01) |
| *H01L 29/40* | (2006.01) |
| *H01L 29/36* | (2006.01) |
| *H01L 29/10* | (2006.01) |

(52) U.S. Cl.
CPC ........ *H01L 29/0619* (2013.01); *H01L 23/528* (2013.01); *H01L 29/402* (2013.01); *H01L 29/407* (2013.01); *H01L 29/4236* (2013.01); *H01L 29/4238* (2013.01); *H01L 29/7397* (2013.01); *H01L 29/1095* (2013.01)

(58) Field of Classification Search
USPC ........................................................ 257/139
See application file for complete search history.

(56) References Cited

U.S. PATENT DOCUMENTS

| | | | |
|---|---|---|---|
| 6,072,214 A | 6/2000 | Herzer et al. | |
| 6,392,272 B1 | 5/2002 | Hasegawa | |
| 6,392,273 B1 * | 5/2002 | Chang ................. | H01L 29/0623 257/330 |
| 6,445,048 B1 | 9/2002 | Pfirsch | |
| 6,737,705 B2 | 5/2004 | Momota et al. | |
| 6,781,199 B2 | 8/2004 | Takahashi | |

(Continued)

FOREIGN PATENT DOCUMENTS

KR 10-2013-0080767 A 7/2013

OTHER PUBLICATIONS

Korean Office Action issued on Aug. 17, 2016 in counterpart Korean Application No. 10-2015-0066304 (4 pages in Korean).

*Primary Examiner* — Zandra Smith
*Assistant Examiner* — Lawrence Tynes, Jr.
(74) *Attorney, Agent, or Firm* — NSIP Law

(57) ABSTRACT

The present examples relate to a power semiconductor device. The present examples also relate to a power semiconductor device that maintains a breakdown voltage and reduces a gate capacitance through improving the structure of an Injection Enhanced Gate Transistor (IEGT), and thereby reduces strength of an electric field compared to alternative technologies. Accordingly, the present examples provide a power semiconductor device with a small energy consumption and with an improved switching functionality.

18 Claims, 12 Drawing Sheets

(56) References Cited

U.S. PATENT DOCUMENTS

| | | | |
|---|---|---|---|
| 6,809,349 B2 | 10/2004 | Yamaguchi et al. | |
| 6,953,968 B2 | 10/2005 | Nakamura et al. | |
| 7,250,345 B2 | 7/2007 | Nakamura et al. | |
| 7,888,733 B2 | 2/2011 | Suekawa | |
| 7,977,704 B2 | 7/2011 | Koyama et al. | |
| 8,178,947 B2 | 5/2012 | Takahashi et al. | |
| 9,041,050 B2 * | 5/2015 | Matsuura | H01L 29/66348 257/139 |
| 2003/0201455 A1 * | 10/2003 | Takahashi | H01L 29/0692 257/136 |
| 2012/0299091 A1 * | 11/2012 | Tsai | H01L 29/7813 257/334 |
| 2013/0328105 A1 * | 12/2013 | Matsuura | H01L 29/0696 257/139 |
| 2015/0236144 A1 * | 8/2015 | Matsuura | H01L 29/7397 257/139 |

\* cited by examiner

POWER SEMICONDUCTOR DEVICE

CROSS-REFERENCE TO RELATED APPLICATION(S)

This application claims the benefit under 35 USC 119(a) of Korean Patent Application No. 10-2015-0066304 filed on May 12, 2015 in the Korean Intellectual Property Office, the entire disclosure of which is incorporated herein by reference for all purposes.

BACKGROUND

1. Field

The following description relates to a power semiconductor device. The following description also relates to a power semiconductor device that maintains a breakdown voltage and reduces gate capacitance through strength reduction of an electric field, as compared to related alternative technologies, by improving the structure of an Injection Enhanced Gate Transistor (IEGT). Thereby, a power semiconductor device with reduced energy consumption and improved switching functionality is provided.

2. Description of Related Art

Minimization and high functionality of power devices are useful in the field of power electronics. Corresponding to these requirements, an improvement in not only high breakdown voltage and high current but also low loss and low noise in a power semiconductor device are being accomplished. In this circumstance, an IEGT, which is an improved version of an Insulated Gate Bipolar Transistor (IGBT) has gathered attention as a device with low ON voltage features and possible of reduction in turn-off losses.

Particularly, recently available alternative technologies disclose technical features of obtaining a Breakdown Voltage Collector-Emitter, specified with zero gate emitter voltage, $BV_{CES}$, of an IEGT by minimizing a floating space of an IEGT or increasing resistivity value of an epi layer.

However, the aforementioned related alternatives incur a decrease in a floating effect, that increases Vce (sat), or Collector-Emitter Saturation voltage or epi layer thickness, and thereby reduces a switching function.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Examples overcome the above disadvantages and other disadvantages not described above. Also, the examples are not required to overcome the disadvantages described above, and an example potentially does not overcome any of the problems described above.

The present description relates to a power semiconductor device that can maintain $BV_{CES}$ while solving problems of related technologies and reduces gate capacitance. As a result, power energy consumption is small and is able to provide improved switching functionality.

In one general aspect, a power semiconductor device includes a substrate having a first surface and a second surface opposite to the first surface, a drift region located on the substrate having a first conductivity type, an emitter electrode located on the first surface of the substrate, a drain electrode located on the second surface of the substrate, an emitter contact region in contact with the emitter electrode, a trench gate structure that surrounds four sides of the emitter contact region, a base region located under the emitter contact region having a second conductivity type, and a floating region located on an exterior region of the trench gate structure that surrounds the trench gate structure and is deeper than the trench gate structure, wherein the floating region is electrically floating and surrounds a bottom surface of the trench gate structure and is separate from the base region, and wherein an impurity concentration of the floating region is lower than an impurity concentration of the base region.

The trench gate structure may include a pair of trench gates extending from the substrate surface to the drift region, the emitter contact region may include a first conductivity type source region and a second conductivity type contact region, and the power semiconductor device may further include a first well region with a first conductivity type configured between the base region and drift region that has a higher impurity concentration than the drift region, and the floating region and the base region may be separated by the first well region.

The power semiconductor device may further include a second conductivity type deep-well region having a greater depth than the floating region, and a pair of dummy trench gates configured not to contact the source region and having a smaller depth than the deep-well region, wherein the floating region and the deep-well region are separated by the pair of dummy trench gates.

The power semiconductor device may further include a termination region located in the substrate and surrounding a cell region, wherein the cell region includes the trench gate structure and the floating region, and the termination region includes a termination ring region and a gate bus line.

The power semiconductor device may further include a termination ring region located in the substrate, a dummy trench gate located between the floating region and the termination ring region, and a second conductivity type deep-well region located between the dummy trench gate and the termination ring region and having a deeper depth than the dummy trench gate, wherein the deep-well region is electrically connected to the emitter electrode.

The power semiconductor device may further include a second conductivity type edge base region located between the dummy trench gate and the deep-well region, with a smaller depth than the dummy trench gate.

In another general aspect, a power semiconductor substrate includes a substrate including a first conductivity type drift region, an emitter electrode located on an upper region of the substrate, a drain electrode located on a lower region of the substrate, a trench emitter structure that is electrically connected to the emitter electrode, a second conductivity type floating region located in the trench emitter structure with a greater depth than the depth of the trench emitter structure, a trench gate structure arranged in an exterior region of the trench emitter structure and surrounding the trench emitter structure, an emitter contact region formed between the trench gate structure and the trench emitter structure and in contact with the emitter electrode, and a second conductivity type base region formed below the emitter contact region, wherein the floating region is electrically floating, and wherein the trench gate structure has a network structure having a net shape whose portions connect with each other, with a planar structure.

The floating region may be in contact with the drift region and may surround a bottom corner of the trench emitter structure.

The width of the floating region may be greater than the width of the base region.

The trench gate structure may include trench regions, the trench regions may include a pair of trench gates configured to extend from the substrate surface to the drift region, and the emitter contact region may include a first conductivity type source region and a second conductivity type contact region.

The trench emitter structure may be formed between the pair of trench gates and the trench emitter structure may be configured not to contact with the source region.

The power semiconductor substrate may further include a second conductivity type termination ring region formed in the inner substrate, and a dummy trench gate with a deeper depth than the base region, wherein the dummy trench gate is formed between the base region and the termination ring region and is configured not to contact with the source region.

The substrate may be divided into a first region and a second region and the first region and the second region are formed alternately on the substrate, the first region including the floating region surrounding the trench emitter structure, and the second region including the emitter contact region surrounding the trench gate structure.

The termination ring region may be overextended on the lower side of the dummy trench gate.

In another general aspect a power semiconductor device includes a drift region located on a substrate having a first conductivity type, an emitter electrode located on a first surface of the substrate, including an emitter contact region in contact with the emitter electrode, a drain electrode located on a second surface of the substrate, wherein the second surface is opposite to the first surface, a trench gate structure that surrounds the emitter contact region, a base region located under the emitter contact region, having a second conductivity type, and an floating region located on an exterior region, surrounding a bottom surface of, separate from, and deeper than the trench gate structure, wherein the floating region is electrically floating, wherein an impurity concentration of the floating region is lower than an impurity concentration of the base region.

The trench gate structure may include a pair of trench gates extending from the substrate surface to the drift region, the emitter contact region may include a first conductivity type source region and a second conductivity type contact region, the power semiconductor device may further include a first well region with a first conductivity type configured between the base region and drift region that has a higher impurity concentration than the drift region, and the floating region and the base region may be separated by the first well region.

The power semiconductor device may further include a second conductivity type deep-well region having a greater depth than the floating region, and a pair of dummy trench gates configured not to contact the source region and having a smaller depth than the deep-well region, wherein the floating region and the deep-well region are separated by the pair of dummy trench gates.

The power semiconductor device may further include a termination region located in the substrate and surrounding a cell region, wherein the cell region includes the trench gate structure and the floating region, and the termination region includes a termination ring region and a gate bus line.

The power semiconductor device may further include a termination ring region located in the substrate, a dummy trench gate located between the floating region and the termination ring region, and a second conductivity type deep-well region located between the dummy trench gate and the termination ring region and having a deeper depth than the dummy trench gate, wherein the deep-well region is electrically connected to the emitter electrode.

The power semiconductor device may further include a second conductivity type edge base region located between the dummy trench gate and the deep-well region, with a smaller depth than the dummy trench gate.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
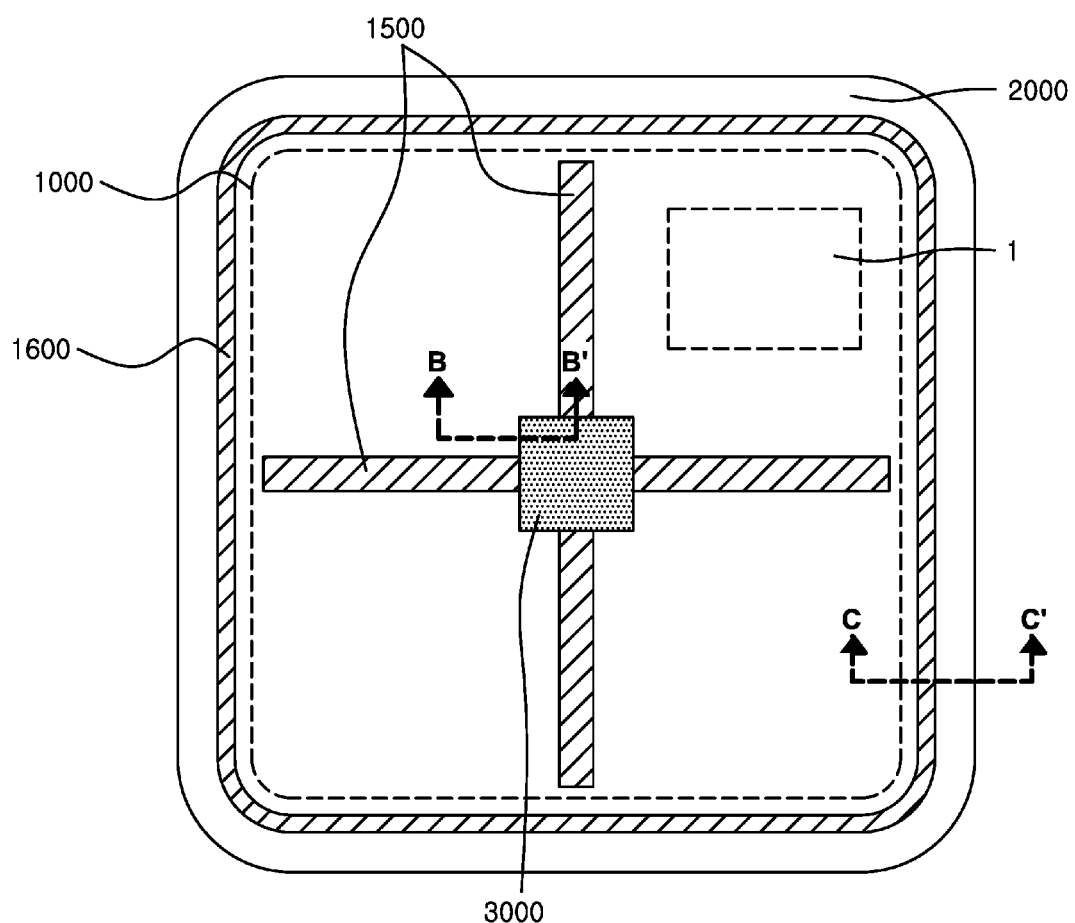
FIG. 1 is a top view of a semiconductor chip including a power semiconductor device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Certain examples are now described in greater detail with reference to the accompanying drawings.

In the following description, the same drawing reference numerals are used for the same elements, even in different drawings. The matters defined in the description, such as detailed constructions of terms and elements, are provided to assist in a comprehensive understanding of the present examples. Accordingly, it is apparent that it is possible for the examples to be carried out without those specifically defined matters. Also, well-known functions or constructions are not described in detail to avoid obscuring the examples with unnecessary detail.

While the expressions such as "first" or "second" are potentially used to refer to various elements, the elements are not intended to be limited by the expressions. Such expressions are used only for the purpose of distinguishing one element from the other when referring to such elements.

The expressions presented are used herein only for the purpose of explaining specific examples and are not intended to place limits on the present examples. An expression in singular form also encompasses plural meaning, unless otherwise specified. Throughout the description, the expression "comprise" or "have" is used only to designate the existence of a characteristic, number, step, operation, element, component or a combination thereof which is described herein, but not to preclude possibility of existence of one or more of the other characteristics, numbers, steps, operations, elements, components or combinations of these or other appropriate additions.

Spatial words, such as below, beneath, lower, above and upper are used to conveniently recite a correlation between one element or features with respect to other elements or features, as illustrated in the drawings. When spatial terminology is used with a direction as illustrated in the drawing, if the illustrated element is upside down, the element that was recited as below and beneath is also potentially considered to be above or upper of another element. Thus, examples presented below include all such instances related to the directions of below and above. An element is also potentially aligned in another direction, and thereby spatial words are interpreted according to the alignment.

Moreover, words such as a first conductivity type and a second conductivity type indicate opposite conductivity types like N-type or P-type. An example that is each recited and illustrated herein includes complementary examples thereof, in which N-type dopants are replaced by P-type dopants and vice versa. For example, in an example, a first conductivity type is an N-type and a second conductivity type is a P-type, but these types are potentially switched in another example.

Hereinafter, examples are illustrated with reference to the attached drawings.

FIG. 1 is a top view of a semiconductor chip comprising a power semiconductor device.

As illustrated in the example of FIG. 1, a semiconductor chip including a power semiconductor device according to a first example includes an active region or a cell region 1000, a semiconductor device operating thereon, and a high voltage (HV) region in the active region 1000 is formed disposed therein. However, the periphery region of a semiconductor chip includes Junction Termination Extension (JTE), which includes an edge termination region at edge region 2000. Herein, the edge termination region 2000 is also referred to as a junction termination region.

Particularly, in the example of FIG. 1, the edge termination region 2000 electrically isolates the active region 1000. To achieve this effect, the termination region 2000 stops a high electric field applied onto the active region 1000. The electric field of the active region gradually decreases towards the edge of the semiconductor chip. Thus, the electric field value becomes closer to zero (0) by using the edge termination region, as the electric field becomes farther from the active region.

FIG. 1 is an example of the power semiconductor device of the present examples disclosing a technical feature of a gate pad 3000 of an IGBT device with a breakdown voltage of a 1200V range configured in the center of the active cell region 1000, and a first gate bus line 1500 that is electrically connected with the gate pad 3000. Accordingly, when a signal is applied to the gate pad 3000, the signal is also applied to the trench gate through a first gate bus line 1500. In this example, the first gate bus line 1500 is configured as an option in order to prevent a delay of a gate signal propagation route that is proper for a mass storage power semiconductor device with a large current of approximately 100 A. In another example, the first gate bus line 1500 is not be used in a small storage power semiconductor device with a lower current, with reference to FIG. 6. Further, the first gate bus line 1500 is formed with a metal layer of Al or Cu in order to lower its resistance. Further, in this example, a second gate bus line 1600 is included to surround a periphery region of an active region 1000. The first gate bus line 1500 and the second gate bus line 1600 are physically separated, but electrically connected through gate polysilicon. An emitter electrode passes between the first gate bus line 1500 and the second gate bus line 1600. Accordingly, a signal is able to be input to the trench gate electrode through the second gate bus line 1600. The second gate bus line 1600 is also formed with a metal layer such as Al or Cu to lower its resistance.

In the example of FIG. 1, a power semiconductor device according to an example discloses a technical feature of semiconductor devices having an active cell region 1. Thus a feature, for example, a trench gate, structure, shape and arrangement of a gate electrode as illustrated in FIG. 1 and so on, for applying a gate voltage to a gate electrode or gate poly in a semiconductor chip comprising the aforementioned features potentially varies.

Figure 2:
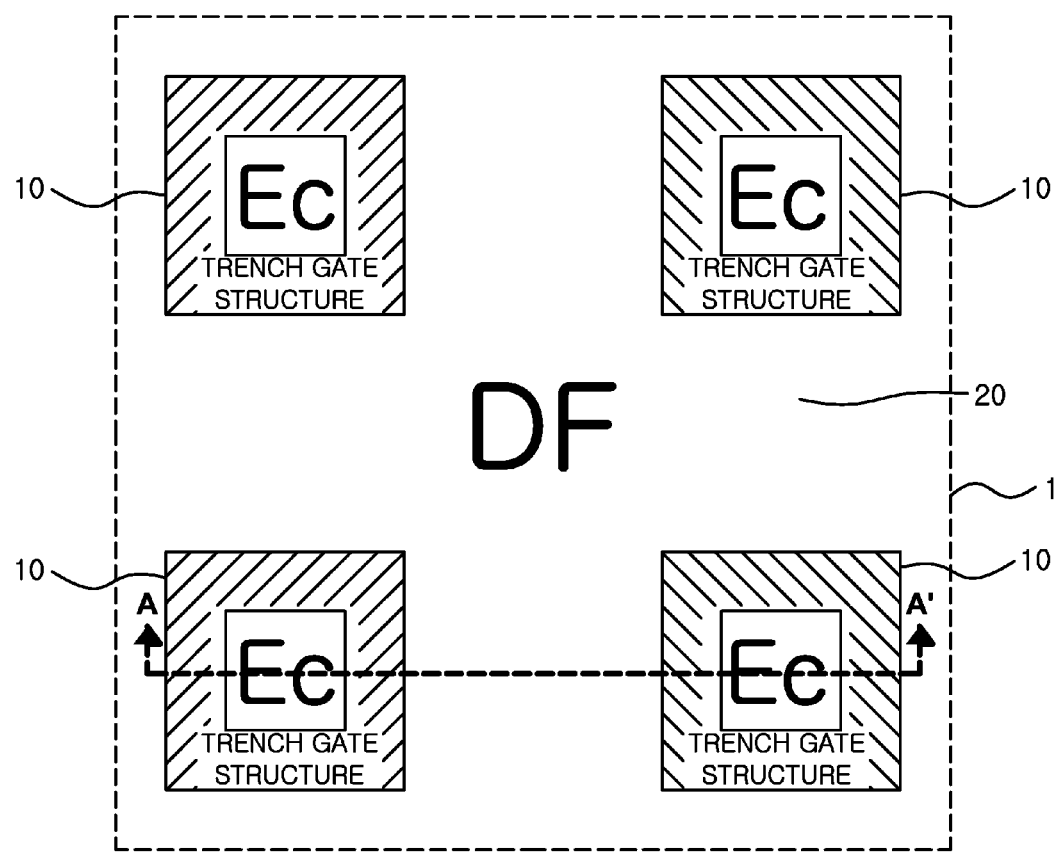
FIG. 2 is a top view of a power semiconductor device according to an example.
Figure 3:
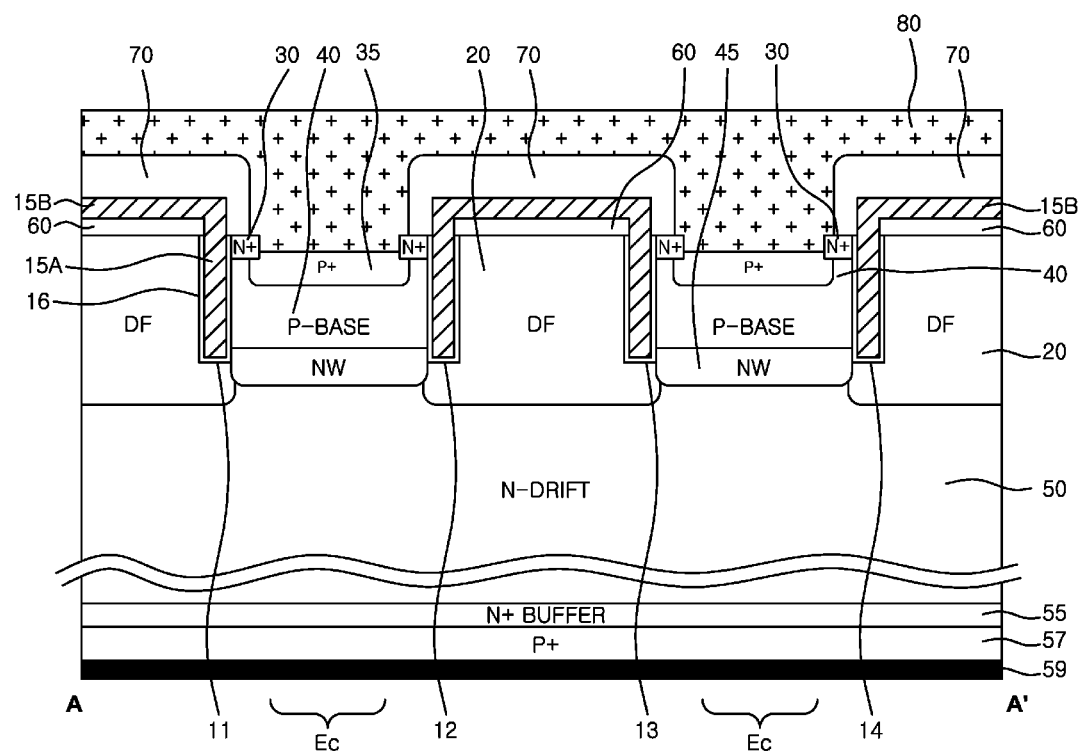
FIG. 3 is a diagram shown according to a cross section (A-A') of FIG. 2.

FIG. 2 is an enlarged top view of the active cell region 1 as shown in FIG. 1 in a power semiconductor device according to an example. The trench gate structure 10 includes a trench gate electrode 15A and a gate insulating layer 16 formed in deep trenches 11, 12, 13 and 14. The emitter contact region Ec defines an active region that contacts the emitter electrode 80. The emitter electrode 80 contacts the P-type contact region 35 and the source region 30, as shown in FIG. 3. Therefore, the emitter contact region Ec includes the P-type contact region 35 and the source region 30.

FIG. 2 shows that a trench gate structure 10 surrounds the emitter contact regions Ec in a top view. For example, the trench gate structure 10 has a rectangular shape or circular shape. A P-type floating region DF 20 is formed adjacent to the trench gate structure 10 and surrounds all of the sides of the trench gate structure 10. These compact structures, including Ec and DF and trench gate structure, result in a high density chip area. In the example of FIG. 2, the emitter contact region Ec is referred to as Ec and the floating region 20 is referred to as DF. Subsequently, the second and third examples use the same reference annotations.

FIG. 3 is a diagram shown according to a cross section A-A' of FIG. 2. As illustrated in FIG. 3, an active cell region 1 of a power semiconductor device according to a first example includes an emitter contact region Ec including a P-type contact region 35 with a high doping concentration and an N-type source region 30 with a high doping concentration. Further, a plurality of trench gate structures 10 configured is formed to surround the emitter contact region Ec. The trench gate structure also includes a trench gate electrode 15A and a gate insulating layer 16 that are formed in a trench. The trench gate electrode 15A is formed of a polysilicon doped with an N-type dopant, according to an example. In this example, the emitter contact region Ec and the gate electrodes 15A, 15B are electrically insulated. Also, a trench gate electrode 15A is connected to the gate bus line 1500 through the conductive material 15B over a floating region 20. Here, the trench gate electrode 15A and the transfer gate electrode 15B are formed of the same material. The conductive material 15B has a role of a bridge connecting a plurality of trench gate electrodes 15A with each other.

A P-type floating region DF 20 is formed to be adjacent to the trench gate structure 10. The P-type floating region 20 has a lower impurity concentration than a high impurity concentration P-type contact region 35 and a high impurity concentration N-type source region 30. The floating region 20 is not electrically connected with either an emitter electrode 80 or gate electrodes 15A, 15B and as a result the floating region 20 is completely floating. The floating region 20 is formed below the emitter electrode 80, but is surrounded by an insulation layer 60. Thus, the floating region 20 blocks a hole carrier from entering into the emitter electrode 80. Thus, a hole carrier concentration increases in an N-drift region 50. Electron concentration in the N-drift region increases accordingly due to conduction modulation. Accordingly, in a switched ON state, a resistance of the N-drift region 50 decreases. Then, the voltage, that is, Vce, between a collector and emitter electrode is reduced. When Vce decreases, power loss is reduced accordingly in a switching ON state. On the contrary, a switched OFF state is disadvantageous because electrons or hole-carriers are difficult to move out due to the floating region. As a result, the floating region 20 is unable to be used as a passage or channel. Thus, a switched OFF period is potentially longer.

The power semiconductor device, which is an IGBT, is formed based on the semiconductor substrate. The substrate includes two epi-layers with different concentrations. In this example, an epi-layer with a high impurity concentration operates with a field stop layer, or buffer layer, 55 and the epi-layer with a lower impurity concentration than the field stop layer 55 and configured on the field stop layer 55 is operated with a drift region 50. In an example, the drift region 50 has a thickness of 90~100 μm. On the other hand, in such an example, the field stop layer has a thickness of 15~30 μm. The field stop layer 55 prevents an electric field formed by the emitter electrode from extending into a P+ collector layer 57. When a field stop layer 55 is not formed, a thickness of a drift region 50 is correspondingly thicker. Thus, there is a potential issue that arises that resistance increase due to the drift region 50 being doped with a low concentration.

A power semiconductor according to an example is potentially applied with an epi-wafer of different concentrations, but examples are not limited to the aforementioned example. For example, the field stop layer 55 is potentially formed by ion-injection of an impurity with a different concentration regarding the semiconductor substrate.

Hereinafter, various features and aspects of a power semiconductor device according to an example are illustrated in the following.

First, a plurality of trench gate structures 10 are formed with a predetermined depth from the upper semiconductor substrate. However, for the convenience of explanation, is the trenches are referred to as a first trench 11, a second trench 12, a third trench 13, and a fourth trench 14 from left to right in FIG. 3.

In the example of FIG. 3, the first to fourth trenches 11, 12, 13 and 14 are formed through an etching process with regard to the semiconductor substrate and respective gates are formed with a similar or identical depth through a similar or identical process.

Respective trenches 11, 12, 13 and 14 potentially each include gate insulation layer 16 and trench gate electrode 15A, respectively. The trench gate electrodes 15A are formed in respective deep trenches 11, 12, 13 and 14 and a gate insulation layer 16 surrounding the trench gate electrodes 15A is formed as well.

The P-type floating region 20 is formed surrounding bottom corners of the second and third trenches 12, 13. For example, the P-type floating region 20 is be formed through ion-injection of P-type impurity such as boron (B) or $BF_2$ and so on, with a predetermined concentration. However, these are merely example impurities, and other appropriate alternatives are used in other examples. Here, the P-type floating region 20 has a smaller concentration than a P-type base region 40. This difference is present to increase a resistance of the P-type floating region 20, thereby allowing a further increase or maintenance of a breakdown voltage.

Herein, the floating region 20 is configured to surround the bottom corners of the second and third trench 12, 13. Thus, each bottom surface of the second and third trench 12, 13 is accordingly configured to be in contact with the P-type floating region 20.

When a power semiconductor device operates, an electric field is increased in bottom corners of all of the trench gates. However, as the P-type floating region 20 is configured to surround the bottom corners of respective trench gates, the concentration of electric field is relieved; and thereby the breakdown voltage of a power semiconductor device is improved. A reason why the electric field is increased in the bottom corner of the trench gate is because the corner shape of the trench is sharply changed, in the examples. Thus, the electric field is increased in the corner of the trench. However, the electric field is relieved elsewhere because the P-type floating region 20 completely surrounds one corner of the trench. Hence, such a floating region formed at a lower depth of the bottom surface of trench region is more advantageous in terms of a breakdown voltage.

Preferably, the P-type floating region 20 is configured to surround the bottom corners of the trenches 12, 13 as illustrated in FIG. 3, and thereby improves operation of the power semiconductor device.

Herein, the power semiconductor device according to a first example includes the features illustrated in FIG. 3. Accordingly, the floating region 20 is formed on a left region of the first trench 11 and a right region of the fourth trench 14 as illustrated in FIG. 3. Likewise, the floating region 20 is configured to completely surround the bottom corners of the first to fourth trenches 11, 12, 13 and 14.

An emitter contact region Ec including a P-type contact region with a high impurity concentration 35 is formed between regions of the first and second trenches 11, 12 and the third and fourth trenches 13, 14, and a P-type base region 40 are formed below the emitter contact region Ec.

First, the N-type source region 30 is formed with a high doping concentration of an N-type impurity concentration and in contact with a trench. For example, the N-type source region is formed using an ion-injection with a high doping concentration of phosphorus (P), arsenic (As) and so on.

However, these are merely examples and other appropriate alternative dopants are used in different examples. The N-type source region 30 is formed on the upper region of a semiconductor substrate respectively in contact with the first to fourth trenches 11, 12, 13 and 14.

A P-type contact region 35 is formed with a high doping concentration of a P-type impurity, and is appropriately configured between regions of the source region 30. Herein, the P-type contact region with a high doping concentration 35 is formed in contact with the source region 30. A P-type base region 40 is formed under the source region 30 and the P-type contact region 35, and is also formed at a predetermined depth from the upper semiconductor substrate. In an example, the base region 40 is formed with a lower impurity concentration than the P-type contact region 35. Thus, the base region 40 becomes a channel region.

According to an example, an N-type well region 45 is formed under the P-type base region 40. The N-type well region 45 restricts hole carrier movement from a drain electrode 59 to a source region 30. For this effect to occur, the N-type well region 45 is formed with a higher impurity concentration than that of an N-type drift region 40. Accordingly, when a hole carrier is accumulated on the drift region 40, electrons crowd into the drift region, and thereby more conductivity modulation is generated, and thus resistance decreases. Accordingly, electron carriers are able to easily move to the drain region even with a small voltage, thereby obtaining a low Vce (sat) feature.

In one example, the depth of the base region 40 formed from the upper semiconductor substrate is formed to be smaller than the depth of respective trenches 11, 12, 13 and 14. Alternatively, in another example, the N-type well region 45 that is a charge storage layer is formed to be deeper than the depth of respective trench gates. Further, there is a trade-off feature of a Vce (sat) reduction effect and a breakdown voltage between collector and emitter BVces reduction due to the depth value and impurity concentrations. Thus, the depth value is appropriately adjusted to manage these effects.

Further, according to an example, the width of the base region 40 or the N-type well region 45 is potentially formed to be smaller than the width of the floating region 20. However, if the width of the base region 40 or the N-type well region 45 becomes smaller, a diffusion rate of electron or hole carrier is accordingly lowered. Thus, a determination of an appropriate width for these elements according to a desired functionality of a semiconductor device is desirable.

Also, an N-type drift region 50 is formed under the base region 40 or N-type well region 45 and the floating region 20. Furthermore, the drift region 50 surrounds a bottom surface of the floating region 20 as illustrated in FIG. 3 and is also formed to have a larger depth than the floating region 20.

Additionally, an N-type field stop layer 55 is formed under the drift region 50. The field stop layer 55 is formed with a higher impurity concentration than that of the drift region 50, as aforementioned. Additionally, in such an example, a drain electrode 59 is formed by deposing a back metal layer on a lower semiconductor substrate that is formed on the field stop layer 55 and the collector layer 57.

As illustrated in FIG. 3, trench gate electrodes 15A formed in the second and third trench 12, 13 are electrically and physically connected through a conductive material 15B. The trench gate electrodes 15A are formed of a polysilicon material that is the same material as the material of the conductive material 15B. Further, the insulated layer 60 is formed on the floating region 20. Likewise, the insulation layer 60 is configured between the conductive material 15B and the floating region 20. Furthermore, an insulation layer 70 covers the conductive material 15B and a portion of the source region 30.

As aforementioned, the emitter electrode 80 is formed on the insulated layer 70 and the emitter electrode 80 electrically connects with the P-type contact region 35 and N-type source region 30. Thus, the emitter electrode 80 is able to form Ohmic contact not only with the P-type contact region 35, but also with the source region 30.

Figure 4:
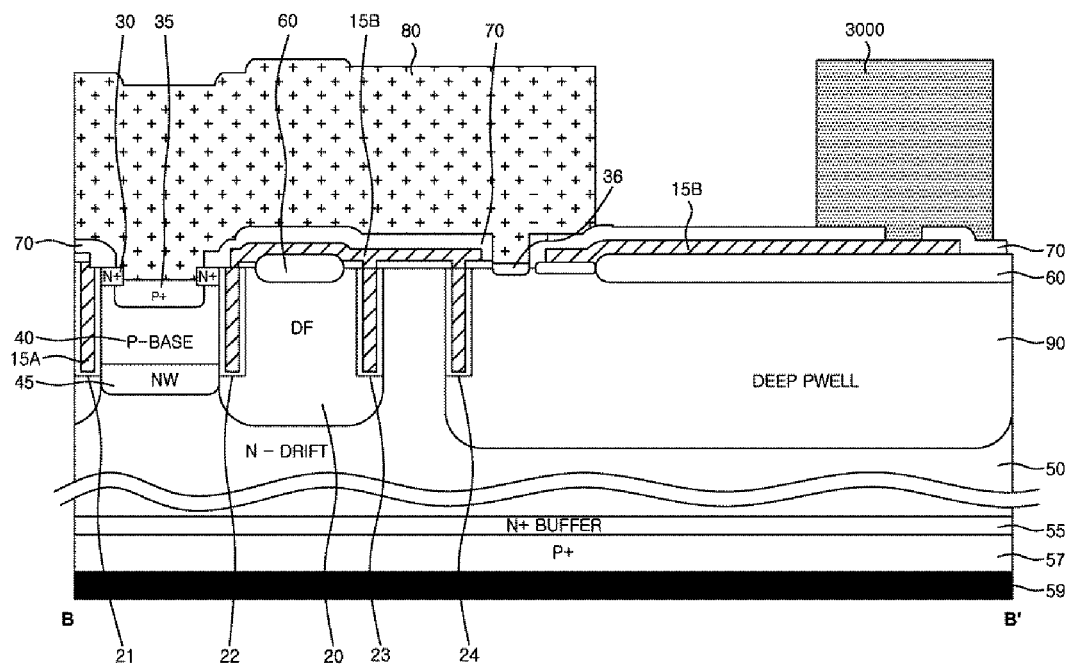
FIG. 4 is a diagram shown according to a cross section (B-B') of FIG. 1.

FIG. 4 is a cross-sectional view of B-B' in FIG. 1 according to an example. The B-B' line passes through the gate pad 3000. Thus, FIG. 4 shows a cell region around the gate pad 3000. As illustrated in FIG. 4, a pair of active trenches 21, 22 and a pair of dummy trenches 23, 24 are formed. The trench gate electrode 15A is formed in a respective trench and is electrically connected with a gate pad 3000 through the conductive material 15B.

The P-type base region 40 is not formed between two dummy trench gates 23, 24 adjacent to the trench gate, in the B' direction. The floating region 20 is unable to contact a first P-type well region 90, because the N-drift region exists between these elements. However, the P-type well region 90 is electrically connected with the emitter electrode 80. When such a deep well region 90 formed below a gate pad 3000 is overly diffused and is in contact with a deep floating region DF 20, the deep floating region 20 and the emitter contact region Ec potentially causes an electrical short circuit. This situation potentially causes a problem issue of an increase in capacitance and other related issues. Accordingly, the deep well region and deep floating region are separated formed using two trenches to prevent contact between these regions.

In this example, a source region 30 is not formed on the pair of dummy trench gates 23, 24. Hence, in the example, there is no channel region. By contrast, an N+ source region 30 is formed on a pair of active trench gates 21, 22 and the channel region is formed on the P-type base region 40, as hence the channel region is referred as an active region.

Thus, in such an example, a P-type deep-well region 90 is connected with an emitter electrode 80, and thus has an identical potential as the emitter contact region Ec of a cell region by connection with the emitter electrode 80. If the P-type deep-well region 90 is not connected with the emitter electrode, a breakdown voltage BV potentially drops. That is, the P-type deep-well region 90 is electrically connected with the emitter electrode 80 through high doping concentration contact layer 36 to have equivalent potential of the emitter contact region Ec of the cell region. As a result, a high voltage of about 1200V generated in the cell region is continuously maintained. In this example, the P-type deep well regions 90 are formed deeper than the pair of dummy trench gates 23, 24. Thus, a doping concentration of the P-type deep-well region 90 is formed to be identical or smaller than a doping concentration of a P-type floating region 20.

Figure 5:
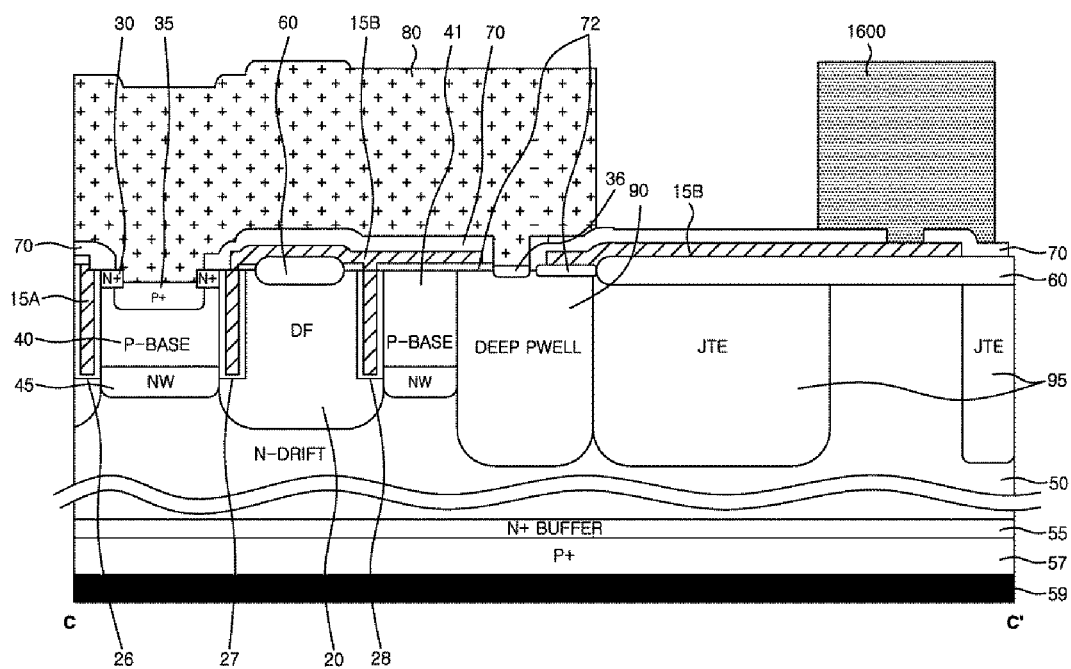
FIG. 5 is a diagram shown according to a cross section (C-C') of FIG. 1.

FIG. 5 is a cross-section of a power semiconductor of an edge cell region C-C', as shown in the example of FIG. 1. As illustrated, a cell region in an active region is formed to be identical with the example of FIG. 3. Three trenches, that is, a pair of active trenches 26 and 27 and a dummy trench 28, are formed. The first P-type base region 40 is formed between the active trenches 26 and 27. Another P-type base region 41 is formed on one side of the dummy trench 28. In such an example, the second P-type base region 41 is located near edge region. Furthermore the second P-type base region 41 has similar features to those of the first P-type base region 40. An N+ source region 30 is formed to be adjacent to the active trenches 26 and 27. Thereby, a channel region is formed on the P-type base region 40. However, the channel region is not formed in the second P-type base region 41, because there is no source region 30 in the second P-type base region 41. Furthermore, a P-type floating region 20 is formed between the dummy trench 28 and the active trench 27.

In this example, a bottom portion of the P-type floating region 20 is completely surrounded by an N-type semiconductor region that includes an N-type drift region 50 and an N-type well region 45. Furthermore, the top portion and sidewall portion of the P-type floating region 20 are surrounded by an insulation layer 60 and the gate insulation layer 16. As a result, the P-type floating region 20 is a completely floating region. Hence, there is an effect of reducing gate capacitance through the floating region. Thus, the Vce value decreases. However, one factor which is to be considered to achieve this effect is that a floating region 20 is to be spaced apart from the second P-type base region 41 or the P-type deep-well region 90. It is required that there is enough space between the second P-type base region 41 and the floating region 20.

Further, the second P-type base region 41 and the P-type deep well region 90 are configured to be in contact with each other in a termination region direction, along the C' direction. Herein, in an example, the P-type deep well region 90 is formed to have a greater depth than the second P-type base region 41. Also, the P-type contact region 36 is potentially formed on the upper P-type deep-well region 90. In this example, the P-type contact region 36 is electrically connected with an emitter electrode 80 that is formed on the upper surface of the substrate. Accordingly, the P-type deep-well region 90 is electrically connected with the emitter electrode 80. As a result, the P-type deep well region 90 has an identical potential that is the same as that of a cell region. This approach allows the maintenance of high voltage potential near a termination region 2000.

Furthermore, in order to apply a gate voltage to a trench gate electrode 15A formed in one of the trenches 26, 27, 28 in an active cell region, the trench gate electrode 15A is connected with the gate pad 3000 through the gate bus line 1600. Between the gate bus line 1600 and the trench gate electrode 15A, there is a conductive material 15B. In this example, the conductive material 15B is formed over the second P-type base region 41 and the P-type deep-well region 90. Thus, therefore an insulation layer 72 formed between these regions that are separated by the insulation layer 72. Through such a use of the insulation layer 72, the second P-type base region 41 and the P-type deep-well region 90 are electrically isolated from the gate electrode 15A.

In this example, the conductive material 15B extends into a termination region. One region of the gate electrode 15A is electrically connected with a second gate bus line 1600. When the trench gate electrode 15A is formed on the termination region and is electrically connected with the second gate bus line 1600, the trench gate electrode 15A assumes an identical potential with that of the second gate bus line 1600. Thus, a gate signal is well transmitted in this manner.

A doping region having ring shape 95 doped with a P-type dopant, that is, the junction field ring 95 is formed on a termination region 2000. In an example, a depth of the junction field ring 95 is almost identical to a depth of a P-type deep well region 90, and is formed to be deeper than the P-type floating region 20.

According to an example, the junction field ring 95 is formed appropriately according to characteristics of a semiconductor device, and the depth is adjusted appropriately by a designer.

For example, an insulation layer 60 is formed on a region between the junction field ring 95 and a conductive material 15B to prevent electric conduction between the junction field ring 95 and the conductive material 15B.

Subsequently, with references to FIGS. 6-12, a power semiconductor device according to a second example and a third example is illustrated.

Figure 6:
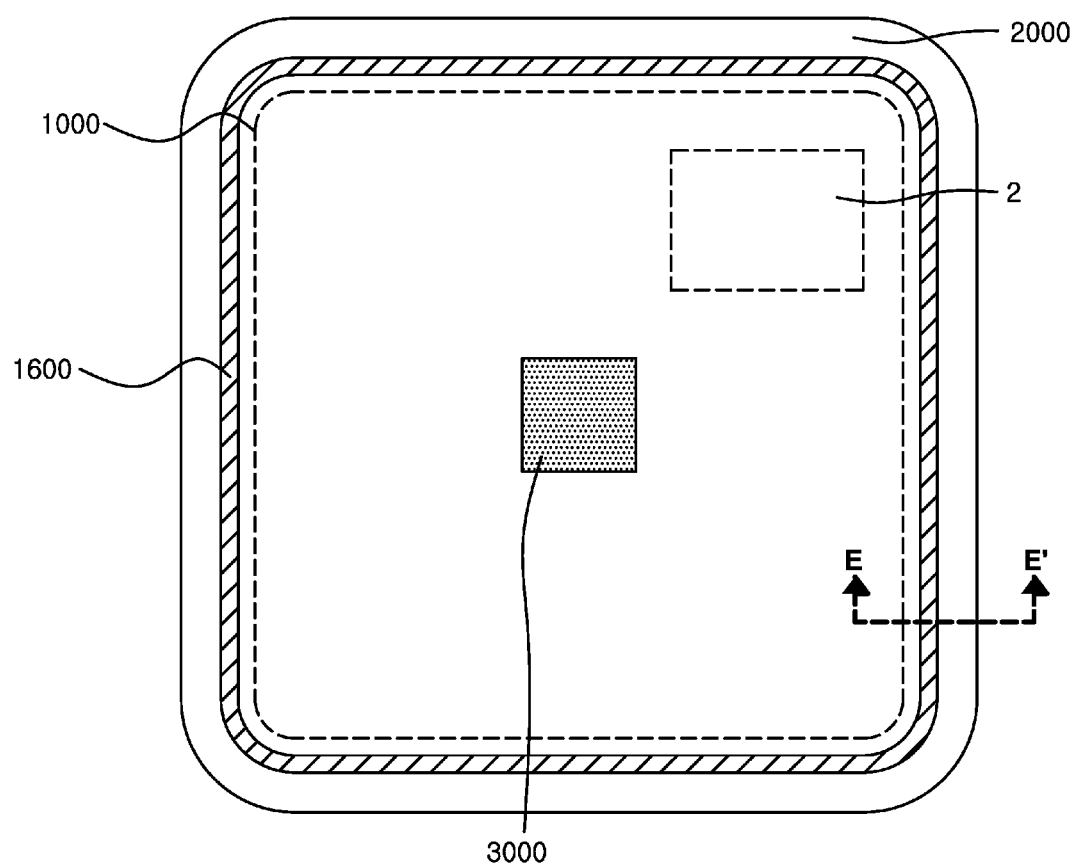
FIG. 6 is a top view of a semiconductor chip including a power semiconductor device according to an example.
Figure 7:
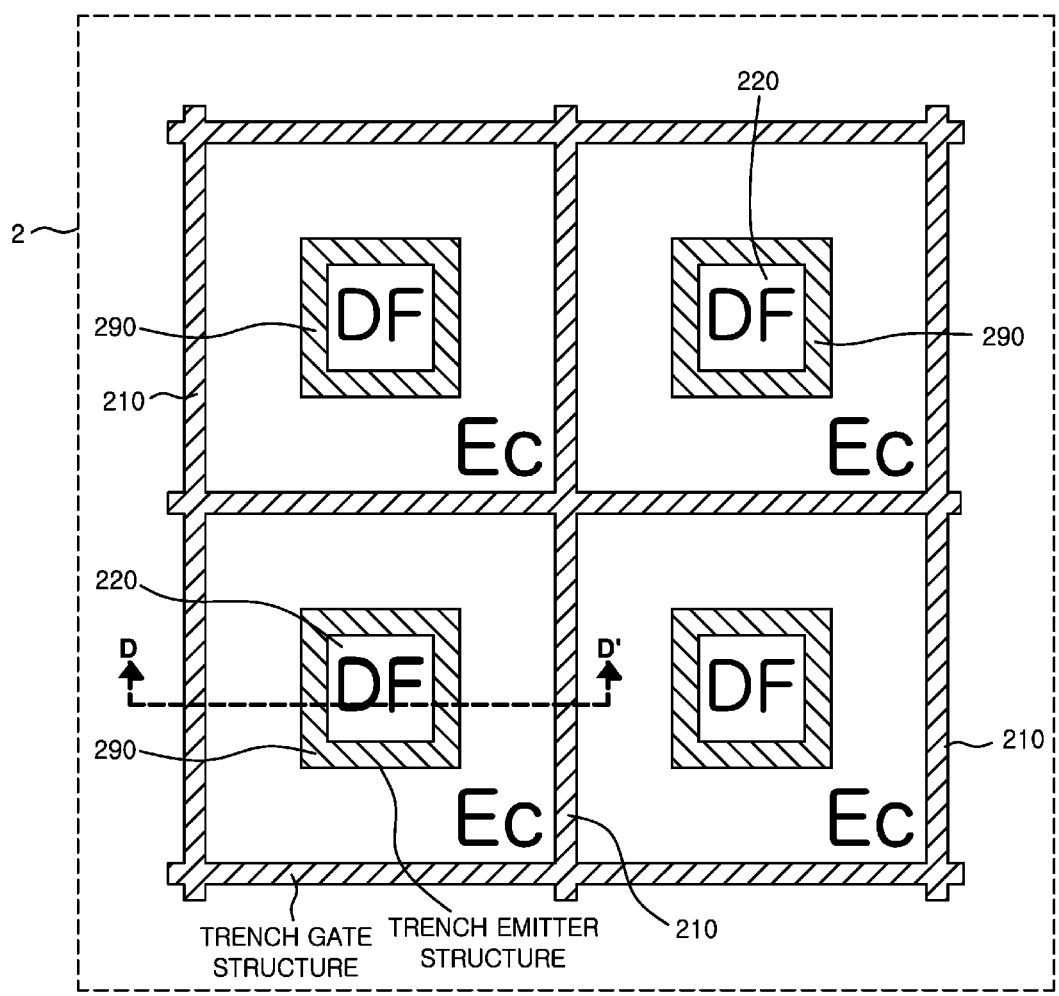
FIG. 7 is a top view of a power semiconductor device according to a second example.
Figure 8:
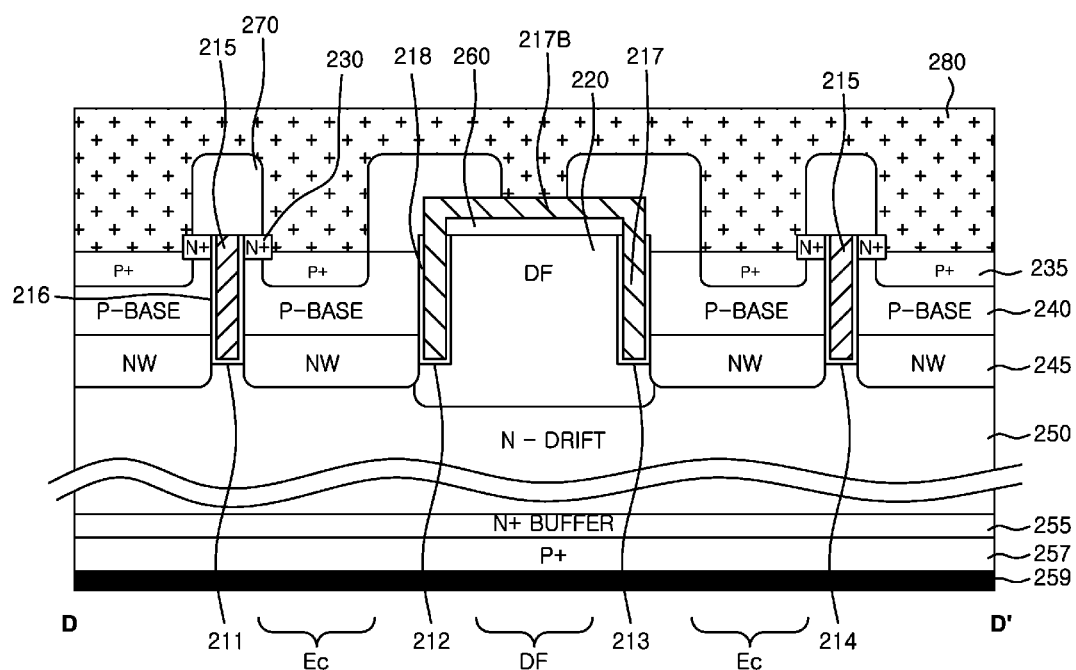
FIG. 8 is a diagram shown according to a cross section (D-D') of FIG. 7.

FIG. 6 is a top view of a power semiconductor device according to a second example. FIG. 7 is a top view of a power semiconductor device according to a second example. FIG. 8 is a diagram shown according to a cross section D-D' of the example of FIG. 7.

In FIG. 6, a second gate bus line 1600 is formed to surround the edge of the active region 1000. The gate bus line 1500 illustrated in the example of FIG. 1 is not formed in this example. The second gate bus line 1600 is electrically connected to a trench gate electrode formed on a cell region 1000. Thus, a signal is input on the trench gate electrode 215 through the second gate bus line 1600. Also, the second gate bus line 1600 is formed with a metal layer of Al or Cu to reduce resistance.

FIG. 7 illustrates a plane view of a power semiconductor device of the present examples. Referring to the example of FIG. 7, a trench gate structure 210 that divides the active region of a semiconductor chip is formed in a network shape that is connected in a net shape. The emitter contact region Ec is formed in a region that is divided by the trench gate structure 210. The emitter contact region Ec includes an N+ source region 230 and P+ contact region 235 that electrically contact an emitter electrode. Further, a floating region DF 220 is formed to be isolated from a trench emitter structure 290. The floating region DF 220 is a P-type doping region that is completely surrounded by a trench emitter structure 290, and therefore the floating region is a completely isolated structure. FIG. 7 illustrates a trench gate structure 210 surrounding the floating region that is an opposite approach to the approach of FIG. 2. In FIG. 2, the floating region DF 20 surrounds the trench gate structure 10, and hence is an opposite structure to that of FIG. 7. The feature is desirable in terms of managing Miller capacitance effects. These issues are discussed further with respect to FIG. 9.

A power semiconductor device of the present examples is illustrated in FIG. 8. A plurality of deep trenches 211, 212, 213 and 214 is formed, each having a predetermined depth from the upper semiconductor substrate. However, trench emitter electrode 217 is formed in two of the trenches 212 and 213, which are electrically connected using a top emitter electrode 280. The deep trenches 212 and 213 form a trench emitter structure 290 as shown in the example of FIG. 7. Trench gate electrodes 215 are formed in the trenches 211, 214 that are disposed outside the trenches 212, 213. Trench gate electrodes 215 are electrically connected with a gate bus line 1600 or a gate pad 3000, in examples. Hereinafter, for the convenience of explanation, is the deep trenches 211, 212, 213, and 214 are referred to as a first trench 211, a second trench 212, a third trench 213, and a third trench 213 and a fourth trench 214.

In an example, the first to fourth trenches 211, 212, 213 and 214 are formed through an etching of the substrate, and then the trench gate electrode or trench emitter electrode are selectively formed in the trench. Herein, the trench gate electrode 215 and the trench emitter electrode 217 are formed by using the same process and the same material. If the electrode in the trench is electrically connected with the emitter electrode 280, it is called a trench emitter electrode 217. If the electrode in the trench is electrically connected with the gate pad 3000 or gate bus lines 1500 and 1600, it is called a trench gate electrode 215. Thus, the trench gate electrode 215 and the trench emitter electrode 217 are electrically connected with the gate pad 3000 and emitter electrode 280, respectively.

All of the deep trenches 211, 212, 213 and 214 are filled with an insulation layer and a conductive material. For example, the conductive material is polysilicon in certain examples. However, appropriate alternative materials are used in other examples. In particular, the deep trenches 211 and 214 comprise gate insulation layers 216 and 218 and electrode materials 215 and 217. The insulation layers 216, 218 are formed along the sidewalls of the deep trenches 211, 212, 213 and 214. In an example, the gate insulation layer 216 and the gate insulation layer 218 are formed through the same process as one another, such as with a silicon oxide layer or silicon oxide layer and a silicon oxynitride layer. However, as noted above, other appropriate materials are used in other examples.

Thus, in this example, the two trench emitter electrodes 217 are connected with conductive material 217B and the trench emitter electrodes 217 are formed in the second trench 212 and third trench 213, respectively. The conductive material 217B is formed of the same material as the trench emitter electrode 217, which is formed over the floating region 220. The conductive material 217B has a bridge shape that connects the plurality of trench emitter electrodes 217. In the example, an upper side of the conductive material 217B is partially exposed. Accordingly, one side of exposed the conductive material 217B can electrically connect with the emitter electrode 280. Thus, the trench emitter electrode 217 is electrically connected with the emitter electrode 280. That is, in the example, the two trench emitter electrodes 217 are not used to open a channel region. Because a source region 230 is not formed in the periphery region of the trench emitter electrodes 217, that aspect of the design also supports this approach.

The floating region 220 doped with a P-type dopant is similar in form to the corresponding floating region previously discussed. The P-type floating region 220 is formed between the second trench 212 and the third trench 213. The floating region 220 is surrounded by the second trench 212 and the third trench 213. In addition, the floating region 220 has a greater depth than those of the second trench 212 and the third trench 213. Furthermore, the floating region 220 is configured to surround the bottom corners of the first and second trench emitters 212, 213, which means that the bottom surfaces of the second trench 212 and the third trench 213 are configured to be in contact with the P-type floating region 220.

In addition, the P-type floating region DF 220 contacts the n-drift region 250, which results in the formation of a PN junction region. The P-type floating region 220 is not electrically connected to any P-type semiconductor region, such as, for example, P-type base region 240. Thus, the P-type floating region 220 is not connected to any ground potential. Thus, the P-type floating region 220 assumes a completely electrically floating state. Also, the P-type floating region 220 has a lower doping concentration than that of the P-type base region 240. When a doping concentration of the P-type floating region increases more than that of the P-type base region 240, an unwanted parasitic capacitance value is possibly induced. Hence, an N-type well region 245 is formed between the P-type floating region 220 and P-type base region 240. Thus, the P-type floating region 220 does not contact P-type base region 240, avoiding the issue discussed above. Such an N-type well region 245 is in contact with both the P-type floating region 220 and the P-type base region 240. Here, the N-type well region 245 has a higher doping concentration than that of the n-drift region 250. However, the formation of N-type well region 245 is an optional process. If no N-type well region 245 is present, the depth of the P-type base region 240 is to be adjusted so that it does not contact the P-type floating region 220. If the P-type base region 240 contacts the P-type floating region 220, the floating state of P-type floating region is not maintained. In addition, the N-type well region 245 plays a role of a barrier for moving the hole carrier toward the source region from the drain region.

An occupied area of P-type base region 240 decreases in size in a whole cell region, because the floating region 220 is formed between the second trench 212 and the third trench 213. Thus, in the presence of a P-type floating region, this approach makes hole carriers slowly discharge toward source region 230 from a collector layer 257 during a turned-off state. In the presence of a P-type floating region 220, the hole carriers stay for a longer time in the n-drift region 250 than in an approach without the formation of a P-type floating region. Thus, an amount of hole carriers increases in the n-drift region 250 and electron carriers move to the n-drift region 250 in order to compensate the hole carriers, and electron carriers are able to sufficiently accumulate in the n-drift region 250. Thus, conductivity modulation is further efficiently executed. Here, Vce decreases between a collector and an emitter electrode as carrier density increases. Both holes and electrons accumulate below the floating region 220, and therefore it requires more time for the extra carriers to move out. This phenomenon potentially generates a switching loss issue.

Further, it is appropriate to optimize a thickness of an n-drift region 250. If the n-drift region 250 becomes too thin, the breakdown voltage of the semiconductor device is potentially degraded. A sufficient depth of the depletion region is obtained from a thicker n-drift region 250. Accordingly, an n-drift thickness is recommended to have a thickness of around 100 μm between the floating region and the N+ buffer region 255. The floating region has a thickness around 8~9 μm. The thickness of the floating region 220 is preferably 8~10% of the n-drift region 250 with respect to obtaining a reasonable breakdown voltage and a sufficient depletion region.

Further, the power semiconductor device is potentially formed as being based on various semiconductor substrates. For example, the substrate is potentially applied as an epi-wafer doped with an N-type or P-type impurity. For example, a Cz wafer made by a Czochralski method, which is favorable for large caliber wafer manufacture, or a wafer with an epi-layer grown on a substrate, are examples of possible approaches to forming an epi-wafer. However, these are merely examples and are not intended to be limiting. Further, a wafer with an N-type epi-layer that is lightly doped is optionally used in another example. Further, in certain examples, the semiconductor substrate optionally includes two epi-layers with different doping concentrations. In such an example, an epi-layer with a high impurity concentration operates with a field stop layer, such as buffer layer 255 and the epi-layer with lower impurity concentration than the field stop layer 255 and configured on the field stop layer 255 is operated with a drift region 250. A power semiconductor according to an example is also optionally applied with an epi-wafer of a different concentration but examples are not limited to the aforementioned examples. For example, the field stop layer and drift region are formed through ion-injection of impurities with different concentrations with respect to the semiconductor substrate.

Hereinafter, an explanation of identical technical feature is omitted and differences from a first example are compared when illustrating features of a power semiconductor device according to a second example.

As shown in FIG. 8, a highly doped N-type source region 230, a highly doped P-type contact region 235 and a lowly doped P-type base region 240 are formed on the both sides of the first trench 211 and the fourth trench 214. However, no N-type source region 230 is formed on both sides of the second trench 212 and the third trench 213, which results in no channel region being formed. If there is no channel region, an amount of current from an emitter electrode 280 to a collector layer 257 is decreased. However, in such an approach, short-circuit characteristics improve. The lowly doped P-type base region 240 is formed over an N-type drift region 250 and it surrounds a bottom corner of the N-type source region 230 and the P-type contact region 235.

The base region 240 has a shallower depth than that of the trenches 211, 212, 213 and 214 from the top surface of the semiconductor substrate. Furthermore, the base region 240 has a smaller width than that of the floating region 220, which correspondingly increases cell density. An N-type drift region 250 is formed over the N+ buffer 255 and it contacts both the N-type well region 245 and a floating region 220. The drift region 250 surrounds the bottom corner of the floating region 220 and is formed to have a deeper depth than that of the floating region 220, as illustrated in FIG. 8. The N-type field stop layer or N+ buffer 255 is formed on the P+ collector layer 257. Also, the field stop layer 255 is formed to have a higher impurity concentration than the drift region 250 as aforementioned.

In this example, a drain electrode 259 is formed on a lower side of a semiconductor substrate formed with the field stop layer 255 and a P-type collector layer 257 through deposition of a back metal layer. Further, an insulation layer 260 is formed over the floating region 220.

Here, according to an example, the insulation layer 270 is formed over the conductive material 217B, however, a portion of the insulation layer 270 is removed to expose the upper side of the conductive material 217B. In this manner, the trench emitter electrode 217 is electrically connected with the emitter electrode 280.

Figure 9A:
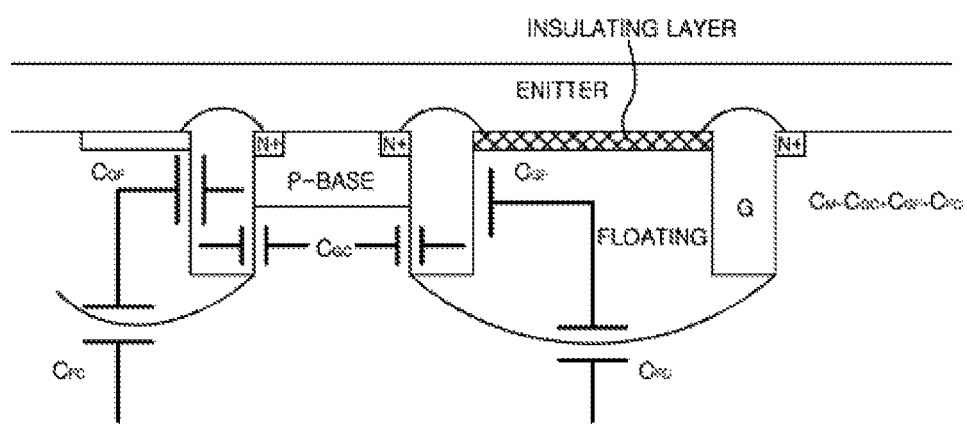
FIGS. 9A-9B are diagrams illustrating a gate capacitance value of a power semiconductor device according to a first and second example.
Figure 9B:
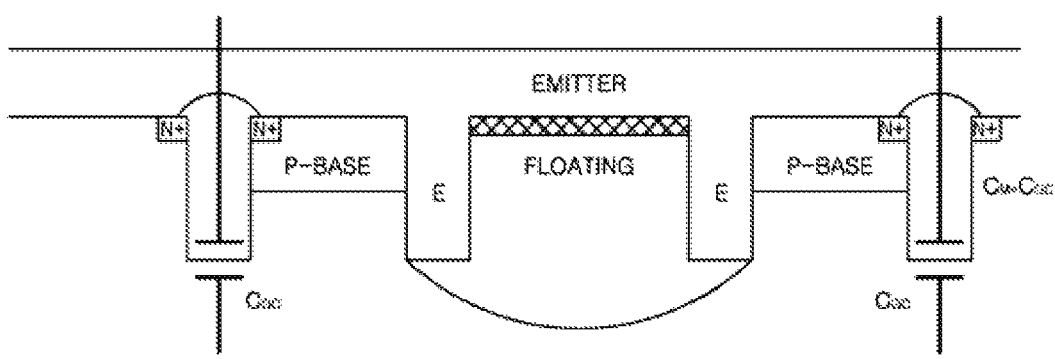

The aforementioned first embodiment has a large Miller capacitance that is discussed further with respect to FIGS. 9A-9B. As illustrated in FIG. 9A, when there is only a trench gate structure, a capacitance value has $C_M=C_{GC}+C_{GF}+C_{FC}$ due to a floating region, wherein the $C_M$ denotes total miller capacitance, $C_{GC}$ denotes the gate-collector capacitance between gate electrode 215 and P+ collector layer 257, $C_{GF}$ denotes the gate-floating capacitance between the gate electrode 215 and the floating region 220, $C_{FC}$ denote the floating-collector capacitance between the floating region 220 and the P+ collector layer 257. $C_{GF}$ and $C_{FC}$ are generated because there is a channel region in the floating region.

By contrast to the example of FIG. 9A, as illustrated in FIG. 9B, if some of the trench gate electrodes are connected to emitter electrodes, the total Miller capacitance $C_M$ significantly decreases. As shown in FIG. 9B, if both the trench gate electrode and the trench emitter electrode are formed as provided in the discussion above, the capacitance value becomes $C_M=C_{GC}$. Only the gate-collector capacitance $C_{GC}$ remains. That is, the $C_{GF}+C_{FC}$ values disappear because there is no channel region. If the trench gate electrode is connected to an emitter electrode 280, as a result the trench gate electrode is no longer a gate electrode playing a role of opening and closing the channel. Likewise, a switching delay reduces when Miller capacitance value decreases and power loss decreases accordingly. That is, switching loss also decreases substantially. Further, a Miller period time decreases, and thus energy loss decreases accordingly, and energy loss required for turning-on also decreases. These effects occur because current is able to flow out immediately into the emitter electrode. This effect is advantageous in achieving a low switching power loss and a small gate driving force.

Figure 10:
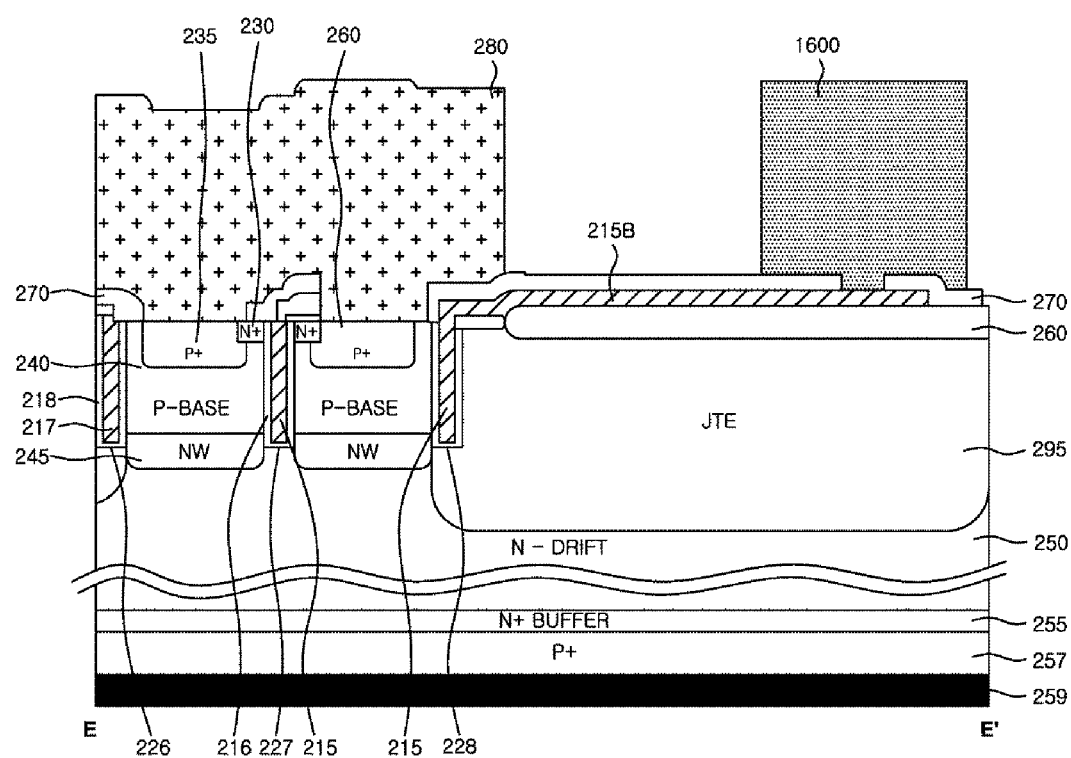
FIG. 10 is diagram shown according to a cross-section (E-E') of FIG. 6.

FIG. 10 is a cross section of a periphery termination region according to a second example. A plurality of deep trenches 226, 227, 228 is formed. The P-type base region 240 is formed between the deep trenches 226, 227, 228. The trench emitter electrode 217 that is electrically connected with an emitter electrode 280 is formed in a deep trench 226. Furthermore, a gate insulation layer 218 is formed on the sidewall of the deep trench 226.

A trench gate electrode 215 is formed in the deep trench 227 and the dummy trench 228. An N+ source region 230 is arranged on both sides of the deep trench 227. The dummy trench 228 is formed between the deep trench 227 and a JTE ring region 295. The N+ source region 230 is not formed on both sides of the dummy trench 228. That is, in this portion of this example, a channel region does not exist.

Further, a JTE ring region 295 is formed near the dummy trench 228. The JTE ring region 295 optionally includes a plurality of field rings, but is illustrated as only forming one JTE ring region 295 in the drawing, but the present examples is not limited to only one JTE ring region 295. However, in examples there is potentially actually a plurality of the field rings in a termination region 2000. Thus, in this example, when the JTE ring region 295 extends to a bottom surface of the dummy trench 228, there is no problem with respect to device features because there is no channel region in the JTE ring region. Rather, when the JTE ring region is in contact with the bottom surface of the dummy trench 228, it is advantageous for a breakdown voltage feature because there is an effect of relieving an electric field.

The second gate bus line 1600 is formed to overlap with the JTE ring region 295 on the termination region 2000. Furthermore, the second gate bus line 1600 is electrically connected through the trench gate electrode 215 and the conductive material 215B. The trench emitter electrode 217 is electrically connected to the emitter electrode 280. Other regions of this example are similar to those presented with respect to the aforementioned regions.

Figure 11:
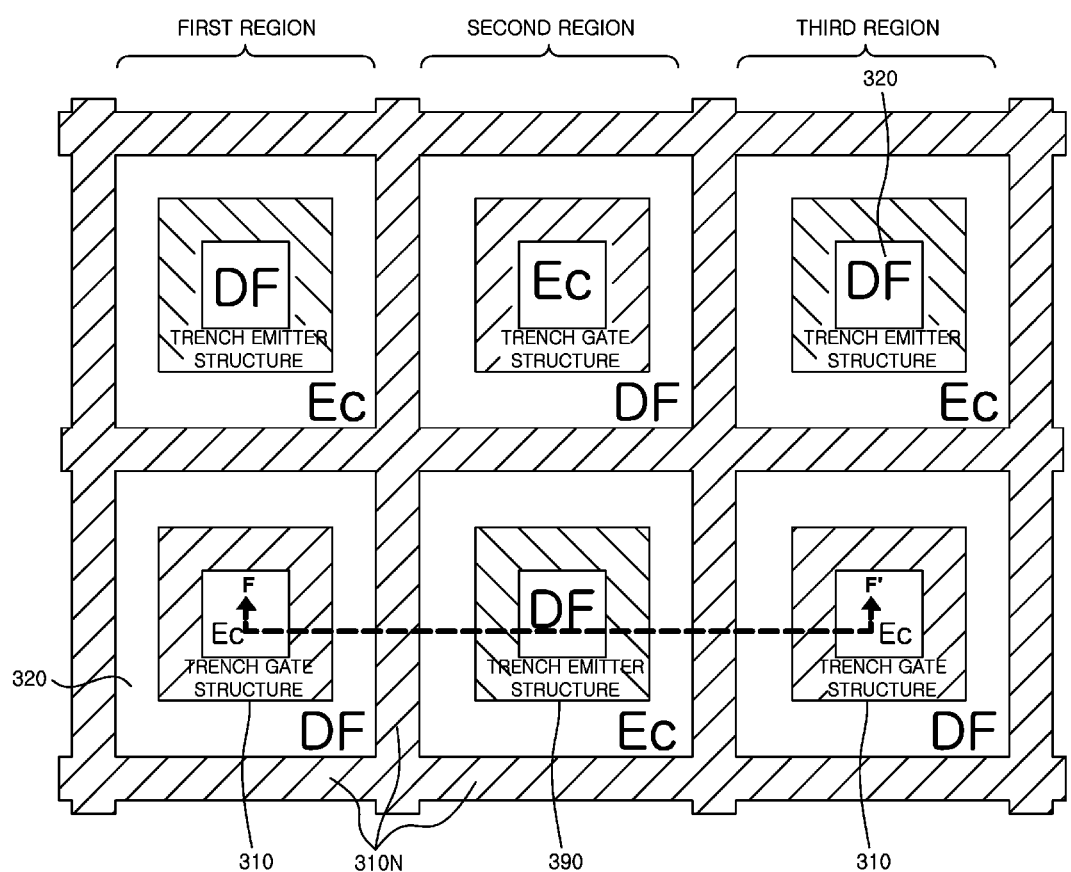
FIG. 11 is a top view of a power semiconductor device according to a third example.
Figure 12:
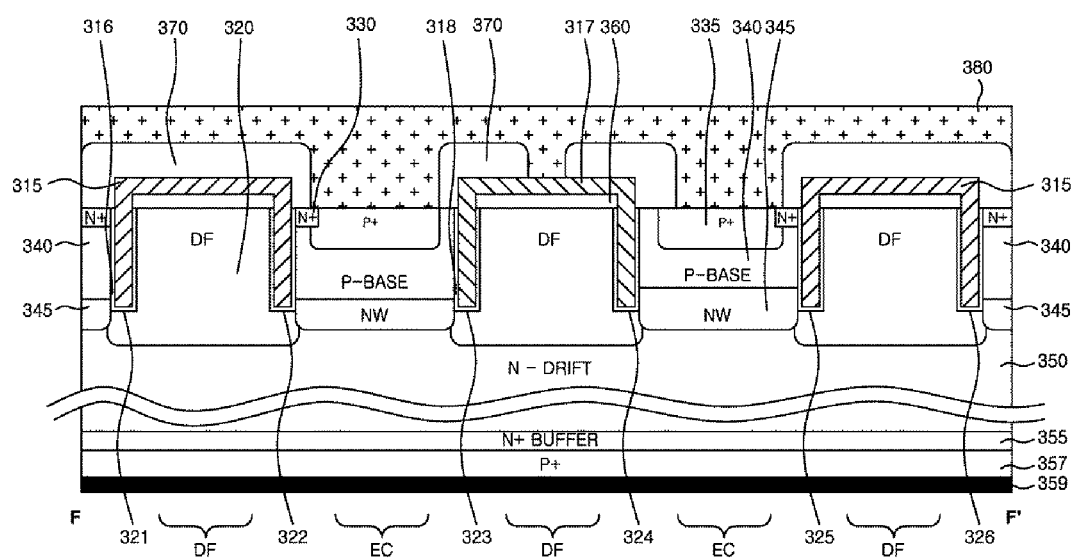
FIG. 12 is a diagram shown according to a cross-section (F-F') of FIG. 11.

A power semiconductor device according to a third example is formed as having a hybrid structure of a power semiconductor device according to a first example and a power semiconductor structure according to a second example, with reference to FIG. 11 and FIG. 12.

FIG. 11 is a top view of a power semiconductor device according to a third example. FIG. 12 is a diagram shown according to a cross-section F-F' of the example of FIG. 11.

As illustrated in the example of FIG. 11, a power semiconductor device according to a third example includes an active region of a semiconductor chip divided with a trench gate structure 310 that is similar with that of a second example. Herein, a floating region 320 is surrounded by the trench emitter structure 390. Furthermore, the emitter contact region Ec is surrounded by the trench gate structure 310. Herein, FIG. 11 divides the power semiconductor device into a first region and a second region for convenience of explanation. The first region is the floating region 320 that is surrounded by the trench emitter structure 390. Further, the second region is the emitter contact region Ec surrounded by the trench gate structure 310. Thus, the first region and the second region are formed alternately. Herein, the third region is identical with the first region, located in a different area of the power semiconductor device. The network trench gate structure 310N has a form that is connected in a network, having a net shape, connecting portions of the network trench gate structure with each other. The network trench gate structure 310N is formed across the region between the first region and the second region. That is, the network trench gate structure 310N divides the elements of the first region and the second region. Further, the first region and the second region have an X-type structure and a Y-type structure, respectively.

Referring to FIG. 11, a chip structure of a power semiconductor device according to a third example is divided into six regions by a trench gate structure 310. Herein, the six regions are divided into inner and outer regions by an electrode that is formed in each of the trench structures. Further, the inner and outer regions are potentially formed with combinations of a floating region DF and an emitter contact region Ec, or alternatively an emitter contact region Ec and a floating region DF. Thus, each region is divided with a DF structure or an Ec structure in reference to a name of the region formed in the middle of each of the six regions, for convenience of explanation.

That is, six regions that are divided by the network trench gate structure 310N are divided according to the following table, referring to FIG. 11.

TABLE 1

| X-type | Y-type | X-type |
| Y-type | X-type | Y-type |

That is, X-type and Y-type regions are formed alternately. Only Y-type exists around X-type and by contrast, only X-type exists around Y-type. That is, each region is formed to be different with the adjacent region. The X-type structure includes the trench emitter structure 390, and thereby divides inner and outer regions and the floating region DF 320 is formed in the trench emitter structure 390. The emitter contact region Ec is formed in the outer region. The trench emitter structure 390 is all electrically connected with an emitter electrode 380, as seen with respect to FIG. 12.

By contrast, a Y-type structure includes the first trench gate structure 310 that divides inner and outer regions, and the emitter contact region Ec is formed in the trench gate structure 310 and a floating region DF 320 is formed in an outer region. Furthermore, a network trench gate structure 310N that surrounds the emitter contact region Ec is formed. The network trench gate structure 310N electrically connects these regions with each other. All of them are connected with a gate electrode 315, as seen with reference to FIG. 12.

The particular features of the power semiconductor device with the above structure refers to the example of FIG. 12 and the particulars are illustrated and discussed further in the following description.

Hereinafter, in illustrating the features of a power semiconductor device according to a third example, illustration regarding identical features is omitted and differences are presented illustrating changes with respect to a first example and a second example.

First, as illustrated in FIG. 12, six deep trenches 321, 322, 323, 324, 325, and 326 are formed having a predetermined depth from the upper semiconductor substrate. Additionally, FIG. 12 illustrates a feature that six deep trenches are formed, unlike FIG. 3 and FIG. 8.

In FIG. 12, a trench emitter electrode 317 is formed in the deep trench 323, 324, which contacts an emitter electrode 380. A plurality of trench gate electrodes are formed in the trench 321, 322, 325, 326, which are electrically connected with a gate pad, not shown, or a gate bus line, not shown.

The deep trench is also potentially formed by an etching process with regard to the semiconductor substrate and respective trenches are formed with a similar or identical depth through a similar or identical process.

Each trench includes an insulation layer and an electrode. In particular, the trenches 323, 324 include thin insulation layers 318 and the trench emitter electrode 317. Trenches 321, 322, 325, 326 include the gate insulation layer 316 and a gate electrode 315. In this example, an electrode is formed in each trench and the insulation layers 316, 318 are formed between the electrodes 315, 317 and the trench.

The P-type floating region 320 is formed on the region between the trenches 321, 322, the region between the trenches 323, 324, and the region between the trenches 325, 326 so as to surround a bottom region of the trenches 321, 322, 323, 324, 325, 326. Herein, the floating region 320 is configured to surround the bottom region of each of the trench structures 321, 322, 323, 324, 325, 326. Thus, the bottom surfaces of the trenches contact the P-type floating region 320.

An N-type source region 330 is formed on sides of trenches 321, 322, 325, 326. However, no N-type source region 330 is formed on sides of trenches 323, 324.

The features are presented according to the disclosed structures of a P-type contact region 335, P-type base region 340, an N-type well region 345, an N-type drift region 350, an N-type field stop layer 355, a P-type collector layer 357, a drain electrode 359, and insulation layers 360, 370. Further, in an example, the base region 340 width is formed to be smaller than the floating region 320 width. However, as the width of the base region 340 becomes smaller, the effect on channel diffusion of an active cell due to side diffusion of the floating region 320 increases, a hence proper determination of the width according to a desired feature of the semiconductor device is advisable.

A plurality of trench gate electrodes 315 are electrically connected with a gate pad for supporting features and functionality of the power semiconductor operation discussed further above. By contrast, the trench emitter electrodes 317 are electrically connected with an emitter electrode 380.

A power semiconductor device according to examples provides a power semiconductor device with low Vce (sat) without reduction of BVCES compared to alternative technologies and an improved switching function through the aforementioned features and approaches.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power semiconductor device comprising:
a substrate having a first surface and a second surface opposite to the first surface;
a drift region located on the substrate having a first conductivity type;
an emitter electrode located on the first surface of the substrate;
a drain electrode located on the second surface of the substrate;
an emitter contact region in contact with the emitter electrode;
a trench gate structure that surrounds four sides of the emitter contact region;
a base region located under the emitter contact region having a second conductivity type;
a floating region located on an exterior region of the trench gate structure that surrounds the trench gate structure and is deeper than the trench gate structure; and
a termination region located in the substrate and surrounding a cell region,
wherein the floating region is electrically floating and surrounds a bottom surface of the trench gate structure and is separate from the base region, and
wherein an impurity concentration of the floating region is lower than an impurity concentration of the base region, and
wherein the cell region comprises the trench gate structure and the floating region, and wherein the termination region comprises a termination ring region and a gate bus line.

2. The power semiconductor device of claim 1, wherein the trench gate structure comprises a pair of trench gates extending from the substrate surface to the drift region,
the emitter contact region comprises a first conductivity type source region and a second conductivity type contact region,
the power semiconductor device further comprises a first well region with a first conductivity type configured between the base region and drift region that has a higher impurity concentration than the drift region, and
the floating region and the base region are separated by the first well region.

3. The power semiconductor device of claim 2, further comprising:
a second conductivity type deep-well region having a greater depth than the floating region; and
a pair of dummy trench gates configured not to contact the source region and having a smaller depth than the deep-well region,
wherein the floating region and the deep-well region are separated by the pair of dummy trench gates.

4. The power semiconductor device of claim 1, further comprising:
a termination ring region located in the substrate;
a dummy trench gate located between the floating region and the termination ring region; and
a second conductivity type deep-well region located between the dummy trench gate and the termination ring region and having a deeper depth than the dummy trench gate,
wherein the deep-well region is electrically connected to the emitter electrode.

5. The power semiconductor device of claim 4, further comprising:
a second conductivity type edge base region located between the dummy trench gate and the deep-well region, with a smaller depth than the dummy trench gate.

6. A power semiconductor substrate comprising:
a substrate comprising a first conductivity type drift region;
an emitter electrode located on an upper region of the substrate;
a drain electrode located on a lower region of the substrate;
a trench emitter structure that is electrically connected to the emitter electrode;
a second conductivity type floating region located in the trench emitter structure with a greater depth than the depth of the trench emitter structure;
a trench gate structure arranged in an exterior region of the trench emitter structure and surrounding the trench emitter structure;
an emitter contact region formed between the trench gate structure and the trench emitter structure and in contact with the emitter electrode; and
a second conductivity type base region formed below the emitter contact region,
wherein the floating region is electrically floating, and
wherein the trench gate structure has a network structure having a net shape whose portions connect with each other, with a planar structure.

7. The power semiconductor substrate of claim 6, wherein the floating region is in contact with the drift region and surrounds a bottom corner of the trench emitter structure.

8. The power semiconductor substrate of claim 6, wherein the width of the floating region is greater than the width of the base region.

9. The power semiconductor substrate of claim 6, wherein
the trench gate structure comprises trench regions,
the trench regions comprise a pair of trench gates configured to extend from the substrate surface to the drift region, and
the emitter contact region comprises a first conductivity type source region and a second conductivity type contact region.

10. The power semiconductor substrate of claim 9, wherein the trench emitter structure is formed between the pair of trench gates and the trench emitter structure is configured not to contact with the source region.

11. The power semiconductor substrate of claim 6, further comprising:
a second conductivity type termination ring region formed in the substrate; and
a dummy trench gate with a deeper depth than the base region,
wherein the dummy trench gate is formed between the base region and the termination ring region and is configured not to contact with the source region.

12. The power semiconductor substrate of claim 6, wherein
the substrate is divided into a first region and a second region and the first region and the second region are formed alternately on the substrate,
the first region comprising the floating region surrounding the trench emitter structure, and the second region comprising the emitter contact region surrounding the trench gate structure.

13. The power semiconductor substrate of claim 11, wherein the termination ring region is overextended on the lower side of the dummy trench gate.

14. A power semiconductor device comprising:
a drift region located on a substrate having a first conductivity type;
an emitter electrode located on a first surface of the substrate, comprising an emitter contact region in contact with the emitter electrode;
a drain electrode located on a second surface of the substrate, wherein the second surface is opposite to the first surface;
a trench gate structure that surrounds the emitter contact region;
a base region located under the emitter contact region, having a second conductivity type;
a floating region located on an exterior region, surrounding a bottom surface of, separate from, and deeper than the trench gate structure; and
a termination region located in the substrate and surrounding a cell region,
wherein the floating region is electrically floating,
wherein an impurity concentration of the floating region is lower than an impurity concentration of the base region,
wherein the cell region comprises the trench gate structure and the floating region, and
wherein the termination region comprises a termination ring region and a gate bus line.

15. The power semiconductor device of claim 14, wherein
the trench gate structure comprises a pair of trench gates extending from the substrate surface to the drift region,
the emitter contact region comprises a first conductivity type source region and a second conductivity type contact region,
the power semiconductor device further comprises a first well region with a first conductivity type configured between the base region and drift region that has a higher impurity concentration than the drift region, and
the floating region and the base region are separated by the first well region.

16. The power semiconductor device of claim 15, further comprising:
a second conductivity type deep-well region having a greater depth than the floating region; and
a pair of dummy trench gates configured not to contact the source region and having a smaller depth than the deep-well region,
wherein the floating region and the deep-well region are separated by the pair of dummy trench gates.

17. The power semiconductor device of claim 14, further comprising:
a termination ring region located in the substrate;
a dummy trench gate located between the floating region and the termination ring region; and
a second conductivity type deep-well region located between the dummy trench gate and the termination ring region and having a deeper depth than the dummy trench gate,
wherein the deep-well region is electrically connected to the emitter electrode.

18. The power semiconductor device of claim 17, further comprising:
a second conductivity type edge base region located between the dummy trench gate and the deep-well region, with a smaller depth than the dummy trench gate.

* * * * *